United States Patent
Taketomi et al.

(10) Patent No.: US 10,030,302 B2
(45) Date of Patent: Jul. 24, 2018

(54) SINTERED BODY COMPRISING LICOO2, SPUTTERING TARGET, AND PRODUCTION METHOD FOR SINTERED BODY COMPRISING LICOO2

(71) Applicant: KOBELCO RESEARCH INSTITUTE, INC., Kobe-shi (JP)

(72) Inventors: Yuichi Taketomi, Takasago (JP); Moriyoshi Kanamaru, Takasago (JP)

(73) Assignee: KOBELCO RESEARCH INSTITUTE, INC., Kobe-shi (JP)

( * ) Notice: Subject to any disclaimer, the term of this patent is extended or adjusted under 35 U.S.C. 154(b) by 537 days.

(21) Appl. No.: 14/765,991

(22) PCT Filed: Mar. 12, 2014

(86) PCT No.: PCT/JP2014/056562
§ 371 (c)(1),
(2) Date: Aug. 5, 2015

(87) PCT Pub. No.: WO2014/142197
PCT Pub. Date: Sep. 18, 2014

(65) Prior Publication Data
US 2015/0376773 A1    Dec. 31, 2015

(30) Foreign Application Priority Data
Mar. 13, 2013    (JP) ................ 2013-050929

(51) Int. Cl.
  *C23C 14/00*    (2006.01)
  *C23C 14/34*    (2006.01)
  (Continued)

(52) U.S. Cl.
  CPC .......... *C23C 14/3414* (2013.01); *C04B 35/01* (2013.01); *C04B 35/645* (2013.01);
  (Continued)

(58) Field of Classification Search
  CPC ............ C23C 14/3414; C23C 14/3407; C23C 14/088; H01J 37/3426; H01J 37/3414; C04B 35/01
  See application file for complete search history.

(56) References Cited

U.S. PATENT DOCUMENTS

2008/0173542 A1  7/2008  Neudecker et al.
2009/0045053 A1  2/2009  Kim et al.
(Continued)

FOREIGN PATENT DOCUMENTS

WO    2011/086649 A1    7/2011
WO    2014/178382 A1    11/2014

OTHER PUBLICATIONS

Hongtao Zhang, et al., "Fabrication and Electrical Properties of Bulk Textured LiCoO$_2$," Journal of American Ceramic Society, vol. 93, No. 7, 2010, pp. 1856-1859.
(Continued)

*Primary Examiner* — John J Brayton
(74) *Attorney, Agent, or Firm* — Oblon, McClelland, Maier & Neustadt, L.L.P.

(57) ABSTRACT

Provided is a sintered body comprising LiCoO$_2$ used for a sputtering target. The area A of a surface of the sintered body that corresponds to a sputtering surface is 200-1500 cm$^2$ and the relative density of the entire sintered body is 75% or higher. When B1 represents the area of a region in which the area ratio that is occupied by pores is 10% or higher in the surface that corresponds to a sputtering surface, the ratio of B1 to the area A is 50% or higher, and the area B2 of a region having a specific resistance of $1.0 \times 10^2$ Ω-cm or smaller in the surface that corresponds to a sputtering surface occupies 25% or more of the area A.

6 Claims, 5 Drawing Sheets

(51) Int. Cl.
*H01M 4/525* (2010.01)
*C04B 35/01* (2006.01)
*C04B 35/645* (2006.01)
*C23C 14/08* (2006.01)
*H01J 37/34* (2006.01)
*H01M 4/04* (2006.01)
*H01M 4/1391* (2010.01)

(52) U.S. Cl.
CPC ........ *C23C 14/088* (2013.01); *H01J 37/3426* (2013.01); *H01M 4/0426* (2013.01); *H01M 4/1391* (2013.01); *H01M 4/525* (2013.01); *C04B 2235/3203* (2013.01); *C04B 2235/3275* (2013.01); *C04B 2235/5436* (2013.01); *C04B 2235/656* (2013.01); *C04B 2235/6567* (2013.01); *C04B 2235/6581* (2013.01); *C04B 2235/77* (2013.01)

(56) References Cited

U.S. PATENT DOCUMENTS

2012/0305391 A1   12/2012   Kim et al.
2012/0305392 A1*  12/2012   Kim .................. C04B 35/01
                                              204/298.13
2015/0014157 A1    1/2015   Taketomi et al.
2015/0041312 A1    2/2015   Taketomi et al.

OTHER PUBLICATIONS

International Search Report and Written Opinion dated Jun. 17, 2014 in PCT/JP2014/056562 filed Mar. 12, 2014.

* cited by examiner

SINTERED BODY COMPRISING LICOO2, SPUTTERING TARGET, AND PRODUCTION METHOD FOR SINTERED BODY COMPRISING LICOO2

FIELD OF TECHNOLOGY

The invention is related to a large size sintered body containing lithium cobaltate ($LiCoO_2$) used for a sputtering target, the sputtering target, and a method for producing the sintered body containing $LiCoO_2$. Specifically, the present invention is related to a large sintered body as well as a sputtering target, containing $LiCoO_2$ and having a size corresponding to a sputtering surface. A thin film comprising $LiCoO_2$ can be formed at a high deposition rate in a stable manner by a sputtering method using the sputtering target. $LiCoO_2$ is useful as a positive electrode active material in an all-solid-state thin film secondary battery or the like. The present invention is also related to a method for producing the sintered body containing $LiCoO_2$.

BACKGROUND ART

Li-based thin-film secondary battery is used for various devices such as a thin film solar cell, a thin film thermoelectric element, and a wireless charging element, and its demand is growing rapidly. The Li-based thin film secondary battery is typically comprises a positive electrode composed of a $LiCoO_2$-containing thin film containing Li and Co that is a transition metal, a solid electrolyte containing Li, and a negative electrode composed of a Li metal thin film.

For the formation of the $LiCoO_2$-containing thin film, a sputtering method is preferably used in which a sputtering target (hereinafter abbreviated also to a target) substantially composed of the same raw material as a film to be sputtered. The sputtering method is advantageous in that conditions for the film formation are easily adjusted, and that the film can easily be formed on a semiconductor substrate.

However, when a film is formed by sputtering, there is a case in that abnormal discharge (arcing), or a discharge mark based on arc discharge is generated. Thus, a stable discharge cannot be secured, causing problems such that the target is cracked and that nodules are generated during the sputtering.

Patent Document 1 pointed out that compound oxides such as $LiCoO_2$ have relatively low conductivity as a specific issue of thin films containing $LiCoO_2$. When the thin films are formed by DC (direct current) discharge sputtering at a high deposition rate, micro-arc discharges are frequently generated due to charging of the target. The deposited films are damaged, accordingly. It is thus difficult to obtain a positive electrode having a large discharge capacity. Radio frequency (RF) discharge sputtering, on the other hand, has a problem of low deposition rate.

The Patent Document 1 thus discloses a method for producing a thin film secondary battery by depositing a layer containing $LiCoO_2$ on a substrate by generating a plasma between a pair of targets that are disposed opposite to each other for the purpose of improving the deposition rate.

PRIOR ART DOCUMENTS

Patent Document

Patent Document 1: Japanese Unexamined Patent Application No. 2004-335192

SUMMARY OF THE INVENTION

Problems to be Solved by the Invention

Increase in the discharge capacity is required for a thin film secondary battery so that it can become an energy harvesting power source equipment by taking advantage of the features such as small size and light weight. For example, increasing the absolute amount of Li ions, that is, increasing thickness of the cathode material is an approach to increase the capacity. However, increasing thickness of the cathode material is not preferable as it deteriorates production efficiency. In consideration of the productivity, DC sputtering having better production efficiency is preferable rather than RF sputtering. In order to adopt the DC sputtering, the $LiCoO_2$ sputtering target is required to have high electrical conductivity.

However, electrical conductivity of a $LiCoO_2$ sputtering target is small as disclosed in Patent Document 1. It is hardly expected to increase the discharge capacity by DC sputtering. Therefore, the Patent Document 1 did not propose use of DC sputtering but a facing target type sputtering system. This method is, however, not efficient because it requires a pair of sputtering targets which are disposed opposite to each other. Furthermore, deposition rate in the method is generally lower than widely-used DC sputtering. It cannot be said to be suitable for industrial production.

From the point of view to improving the deposition rate during the sputtering, it has thus been desired to provide a $LiCoO_2$ sputtering target and an oxide sintered body having high electrical conductivity, which are suitable for the excellent DC sputtering productivity.

Furthermore, demand for film formation to a large substrate by a sputtering method has been increasing. The target is also getting large in size accordingly. It has thus been strongly desired to provide a $LiCoO_2$ sputtering target and an oxide sintered body that can solve the above-mentioned problems even when the area that corresponds to the sputtering surface is large.

The present invention has been made in view of the above-mentioned circumstance. An object of the present invention is to provide a $LiCoO_2$-containing sintered body and a sputtering target of large size which make it possible to form a thin film at a high deposition rate stably without generating abnormal discharge; and a method for manufacturing the sintered body.

Means for Solving the Problems

The $LiCoO_2$-containing sintered body according to the present invention which can solve the problems is a sintered body containing $LiCoO_2$ used for a sputtering target. The sintered body has an area A, corresponding to a sputtering surface, of 200 $cm^2$ or larger and 1500 $cm^2$ or smaller, and a relative density of the entire sintered body of 75% or higher. When B1 represents an area of a region in which the area ratio that is occupied by pores is 10% or larger in the surface corresponding to the sputtering surface, the ratio of B1 to the area A is 50% or larger in the sintered body. When B2 represents an area of a region having a specific resistance of $1.0 \times 10^2$ Ω-cm or smaller in the surface corresponding to the sputtering surface, the ratio of B2 to the area A is 25% or larger in the sintered body.

Further, the sputtering target according to the present invention which can solve the problems has an area C representing the sputtering surface, and a relative density of the entire sputtering target of 75% or higher. When D1 represents an area of a region in which the area ratio that is occupied by pores is 10% or larger in the sputtering surface, the ratio of D1 to the area C is 50% or larger in the sputtering target. When D2 represents an area of a region having a specific resistance of $1.0 \times 10^2$ Ω-cm or smaller in the sputtering surface, the ratio of D2 to the area C is 25% or larger in the sputtering target.

Furthermore, the method for producing the sintered body containing $LiCoO_2$ according to the present invention which can solve the problems comprises sintering by a hot press method using a graphite mold in which environment of heating prior to the sintering is controlled to a vacuum atmosphere and heat treatment in an atmosphere containing oxygen after the sintering by the hot press.

In a preferred embodiment of the present invention, the sintering by the hot press is conducted in a vacuum atmosphere.

In a preferred embodiment of the present invention, the sintering by the hot press is conducted at a temperature of 700 to 1000° C. and at a pressure of 10 to 100 MPa.

In a preferred embodiment of the present invention, the heat treatment is carried out at a temperature of 300° C. or higher and 1200° C. or lower.

Effects of the Invention

Provided by the present invention are a large size sintered body containing $LiCoO_2$ used for producing a sputtering target and having a high relative density and low specific resistance over a wide range of the sputtering surface, and a sputtering target. A thin film comprising $LiCoO_2$ can be formed at a high deposition rate by a sputtering method in a stable manner without abnormal discharge. $LiCoO_2$ is useful as a positive electrode active material in a secondary battery or the like. The sintered body containing $LiCoO_2$ and the sputtering target of the present invention are favorably used for DC sputtering having excellent productivity.

MODE FOR CARRYING OUT THE INVENTION

The present inventors conducted studies for the purpose of providing a sintered body containing $LiCoO_2$ and a sputtering target (simply referred to as a target occasionally hereinbelow) which are favorably used for DC sputtering. The sintered body containing $LiCoO_2$ is for production of a large size sputtering target and has a surface to be used as a sputtering surface of a sputtering target (referred to "sputtering surface" hereinbelow) of 200 $cm^2$ or larger and 1500 $cm^2$ or smaller in size. The DC sputtering may be conducted at a high deposition rate when forming thin films without abnormal discharge during the sputtering, and thus excellent productivity. A sintering method by a hot press method using a graphite mold is adopted for the study since the sintered body can be easily densified by the method.

The present inventors firstly carried out sintering in order to manufacture a small size sintered body containing $LiCoO_2$ by a hot press method using a graphite mold in an inert atmosphere such as nitrogen atmosphere. It was found as a result that specific resistance of the sintered body significantly increased as described below.

It was deduced that the increase in the specific resistance was caused by distortion of the crystal lattice due to the reduction during the hot pressing although detailed reason was unspecified. As Li ions play a role of electrical conduction in sintered body containing $LiCoO_2$, the distortion could hinder the Li ions from moving in the crystal lattice.

The specific resistance remarkably decreased by subjecting a sintered body to a heating treatment in an oxygen-containing atmosphere after the hot press. Although the detailed mechanism is not clear, it is supposed that distortion was eliminated by restoring oxygen in the crystal lattice and migration of the Li ions was facilitated.

The present inventors prepared a large-sized sintering body having a diameter of 300 mm and an area of 707 $cm^2$ in the same method next. However, abnormal discharges occurred when a film was formed at a high deposition rate by DC sputtering of a large-sized sintering body containing $LiCoO_2$. It was elucidated through an investigation by the present inventors that the abnormal discharge was caused by variation of specific resistance. Causes of the variation of specific resistance were then studied in detail.

Figure 4:
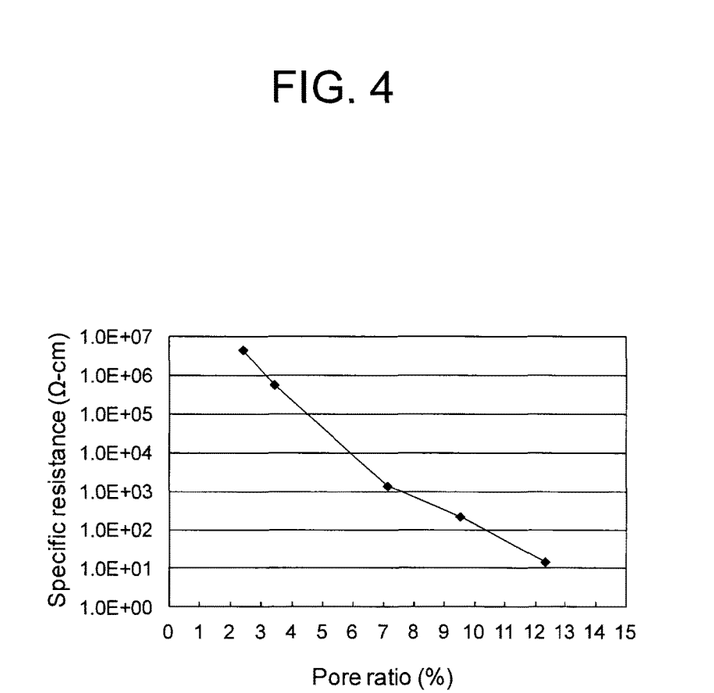
FIG. 4 is a graph indicating relation between the ratio of the total area of the pores occupying in an arbitrary area (pore ratio) and the specific resistance of the sintered body No. 1 explained in Example 1.

As a result of the study, it was unexpectedly found that amount of pores (voids, defects) generated in the sintered body significantly affects to the specific resistance and that variation in the amount of the pores causes the variation of the specific resistance. FIG. 4 is a graph indicating a relationship between the specific resistance and the ratio of the total area of the pores occupying in an arbitrary area (hereinafter, referred to pore ratio) obtained by measuring the several points of the sintered body No. 1 in Example 1 described below. As shown in FIG. 4, the specific resistance increased when the pore ratio was small. Because the pores are not conductive, the pores present in the interior of a material are likely to be a resistance factor in general. As the area ratio of the pores increases, the conductivity is presumably decreased. Considering that, the finding was extremely surprising.

As a result of further studies, it was found that the variation of the specific resistance can be suppressed and the film can be deposited at a high deposition rate (that is, DC sputtering may be applicable) if area percentage of regions in which the area ratio of regions occupied by the pores is 10% or larger (that is, the regions having the pore ratio of 10% or larger) is 50% or higher in the entire sputtering surface in the surface of the sintered body corresponding to the sputtering surface.

And the present invention has been completed by finding the followings. It is necessary to conduct the sintering by a hot press method using a graphite mold in which environment of heating prior to the sintering is controlled to a vacuum atmosphere instead of an inert gas atmosphere and to conduct a heat treatment in an atmosphere containing oxygen after the sintering in order to increase the region having the specified pore ratio. It is also effective to control the atmosphere during the sintering to preferably a vacuum environment.

The regions having the specified pore ratio are increased and the variation of the specific resistance is suppressed by controlling the environment before sintering (preferably during the sintering as well) to vacuum atmosphere and conducting a heat treated in an oxygen-containing atmosphere after the sintering. The detailed reason is not clear but supposed as follows. Firstly, in terms of the environment before sintering (preferably during the sintering as well), effects of heat transfer by way of gas molecules were supposed to be small due to small density of the gas molecules in the vacuum environment as compared with an inert gas atmosphere such as nitrogen atmosphere. It is thus supposed that the pores are uniformly dispersed in a sintered body. Further, by the heat treatment in oxygen atmosphere after the sintering, oxygen is sufficiently diffused in the sintered body. It is considered that these effects resulted in suppressing variation of the specific resistance.

The following is a detailed explanation of the present invention.

(Sintered Body Containing $LiCoO_2$)

The sintered body containing $LiCoO_2$ according to the present invention is characterized in that; area A of sputtering surface is 200 $cm^2$ or larger and 1500 $cm^2$ or smaller in the sintered body; relative density of the entire sintered body is 75% or higher; ratio of B1 to the area A is 50% or larger wherein B1 represents an area of a region in which the area ratio that is occupied by pores is 10% or larger in the sputtering surface; ratio of B2 to the area A is 25% or larger wherein B2 represents an area of a region having a specific resistance of $1.0 \times 10^2$ Ω-cm or smaller.

In the present invention, "sintered body" means a single sintered body. It does not mean that joined a plurality of sintered bodies together. That is, the sintered body containing $LiCoO_2$ of the present invention consists of a single sintered body. It is characterized in that the relative density is high, and that variation of the specific resistance is small since regions satisfying a predetermined pore ratio are widely spread despite of its large size.

Shape of the sintered body is not particularly limited, and may be plate-shape, disk-shape, cylinder-shape or the like.

The sintered body containing $LiCoO_2$ of the present invention comprises lithium cobaltate ($LiCoO_2$). In the sintered body containing $LiCoO_2$, ratio of $LiCoO_2$ to the entire sintered body is preferably 50 mass % or larger, more preferably 80 mass % or larger, and even more preferably 90 mass % or larger. The most preferably the entire (100 mass %) sintered body consists of $LiCoO_2$. Constituents other than $LiCoO_2$ are, for example, transition metals (Mn, Fe, or Ni) other than Co, and compound oxide comprising Li and a transition metal other than Co.

Further, the sintered body containing $LiCoO_2$ of the present invention is large in size satisfying the area A corresponding to the sputtering surface to be 200 $cm^2$ or larger and 1500 $cm^2$ or smaller in the sintered body.

Furthermore, the sintered body containing $LiCoO_2$ of the present invention satisfies relative density of the entire sintered body of 75% or higher. As the relative density increases, cracking in target and generation of nodules can be circumvented during sputtering. It thus becomes possible to maintain stable discharge continuously through the end of life of the target. The higher the relative density is, the more preferable. The relative density is preferably 80% or higher. The upper limit is not particularly limited from the point of above-mentioned viewpoint. However, it is preferably about 99% or lower by taking the productivity into consideration. Moreover, from the view point of widely distributing the pores which contribute to suppressing variation of specific resistance, the relative density of the entire sintered body is preferably 95% or lower, and more preferably 90% or lower.

Moreover, the greatest features of the sintered body according to the present invention are that the relative density is high as explained above and that the regions having the pore ratio of 10% or larger occupy a half or more in an area corresponding to the sputtering surface, and hence the regions having a low specific resistance occupy 25% or larger in the area corresponding to the sputtering surface in spite of the large sputtering area when the ratio of total area of pores occupying in an arbitrary area (pore ratio) and distribution of the specific resistance are measured.

More specifically, regarding the pores, when A represents surface area corresponding to the sputtering surface on a sintered body and B1 represents area of region in which area ratio occupied by the pores is 10% or more, ratio of B1 to A, B/A is 50% or larger. The region having the area ratio occupied by the pores of 10% or higher significantly contributes to decreasing the specific resistance without significant decrease in the relative density. Therefore, by increasing the region having the area ratio occupied by the pores of 10% or higher in the surface corresponding to the sputtering surface, the specific resistance can be decreased over a broad range of the target surface.

The present invention is characterized in that the lower limit of the ratio of the area occupied by the pores is specified as 10% or higher while the upper limit is not limited and it may be the maximum value of the area ratio in the observed area. For example in the case of sintered body No. 1 in Example 1 as described below, the maximum value of the pore ratio was 12.3% as indicated in Table 2. Accordingly, the B1 in this case is an area of the region having the pore ratio of 10% or higher and 12.3%. In a similar manner, in the case of sintered body No. 2 in Example 1, the maximum value of the pore ratio was 14.3% as indicated in Table 2. Accordingly, the B1 in this case is an area of the region having the pore ratio of 10% or higher and 14.3%.

In order to exert the effect, the larger the percentage of B1/A (area ratio of the region having the pore ratio of 10% or larger), the more preferable. The percentage is preferably 60% or larger, more preferably 75% or larger, even more preferably 85% or larger, and most preferably 100%. Taking the productivity into consideration, however, the percentage of B1/A is preferably 99% or smaller, and more preferably 90% or smaller.

Regarding the specific resistance, percentage of B2/A is 25% or larger when B2 represents an area of a region having a specific resistance of $1.0 \times 10^2$ Ω-cm or smaller in the sputtering surface. In the present invention, variation of specific resistance in the sintered body is suppressed because the pores are appropriately controlled as explained above.

The larger the percentage of B2/A (area ratio of the region having small specific resistance), the more preferable. The percentage is preferably 35% or larger, more preferably 60% or larger, even more preferably 75% or larger, and most preferably 100%. Taking the productivity into consideration, however, the percentage of B2/A is preferably 99% or smaller, and more preferably 90% or smaller.

The specific resistance can be measured by a four-point probe method.

Further, from the point of view to decreasing specific resistance of the entire sintered body, specific resistance is preferably equal to $1.0 \times 10^3$ Ω-cm or smaller in regions occupying 85 area % or larger of the sputtering surface of the sintered body. The smaller the specific resistance is, the more preferable.

The sintered body according to the present invention is explained above.

The manufacturing method of the sintered body is explained next in the following.

(Production Method of Sintered Body Containing $LiCoO_2$)

The production method of the sintered body containing $LiCoO_2$ according to the present invention is characterized in that when the sintering is carried out by the hot press method using a graphite mold, the atmosphere during heating prior to the sintering is made to vacuum environment. It is also characterized in that a heat treatment is conducted after the sintering by the hot press in an atmosphere containing oxygen.

As described above, the sintering is carried out by a hot press method using a graphite mold in the present invention. The hot press method is conducted for the purpose of securing the specific pore ratio and further improving the relative density.

Sintering methods are generally categorized to a pressureless sintering method and a hot press sintering method. In the pressureless sintering method, raw materials are sintered in an air atmosphere. In the hot press sintering method, raw materials are filled in a mold such as a graphite mold and then sintered under a uniaxial pressuring. As compared to the pressureless sintering method in which the sintering is conducted by only heating, the hot press sintering method can achieve sintering at low temperature with a supportive effect by the pressuring and produce a sintered body having a fine crystal structure. In a sintered body, pores are formed where crystal grains are contacting with each other. It is considered therefore that a sintered body having a crystal structure with uniformly dispersed pores may be obtained by forming the fine crystal structure by the hot press method.

Moreover, the hot press method can increase relative density of a sintered body. On the other hand, it is difficult in principle to densify a sintered body by the pressureless sintering method. It is hard to attain a sintered body having a relative density as high as that produced by the hot press method. The hot press method is particularly effective to a compound oxide such as $LiCoO_2$ that is a subject material of the present invention as it is hard to increase the relative density in its nature.

There is a case in which a ceramic mold is used in a hot press method. However, use of a graphite mold is preferably because manufacturing a ceramic mold of large size is difficult.

From the described viewpoints, the hot press method using a graphite mold was adopted in the present invention.

Hereinafter, the manufacturing method is explained in detail in accordance with the order of the processes.

(Raw Material)

As the raw material, a powder containing $LiCoO_2$ is used. The powder may contain other kinds of compound oxide depending on composition of the sintered body. In the present invention, there is no need to use any special material as the above powder containing $LiCoO_2$, but commercially available products of high purity can be used without any treatment.

(Sintering by Hot Press Method Using Graphite Mold)

The raw material powder is filled into a graphite mold. In the filling into the graphite mold, the raw material powder may directly be filled without any pre-forming, or may be filled once into another mold and then pre-formed with a mold press, after which the pre-form may be filled into the graphite mold. The latter pre-forming is performed for the purpose of improving the handling abilities when the pre-form is set to a prescribed mold in the hot press step, and the raw material may preferably be made into a pre-form by the application of a pressure of, for example, about 0.5 to 1.0 $tonf/cm^2$.

When the sintering is carried out in the present invention, it is important to control the environment during the heating prior to the sintering (the environment in the course of heating before reaching to sintering temperature) to a vacuum atmosphere. By conducting sintering in that manner, pores which are useful to decrease the specific resistance can be uniformly dispersed over the entire sintered body. In hot press method, the environment prior to and during sintering is generally controlled to an inert atmosphere such as for example nitrogen gas and argon gas. However, when the environment prior to the sintering is controlled to a nitrogen gas atmosphere in the production of a large-size sintered body as in the present invention, the predetermined pore ratio cannot be attained and variation of the specific resistance becomes large (see sample No. 1 of Table 2 in Example 1 described below).

The degree of vacuum is not particularly limited. It is preferably controlled to less than about 3 Pa.

It is important to take care of atmosphere in processes before sintering. However, other conditions are not particularly limited. For example, the heating rate may be in a range of about 1 to 20° C./min.

Subsequently, the sintering is carried out when the temperature reached the sintering temperature. The atmosphere may be either a vacuum environment or an inert gas atmosphere. For example, inert gases such as Ar and $N_2$ are used for the inert atmosphere. The method to control the atmosphere is not particularly limited, but the atmosphere may be adjusted by, for example, introducing Ar gas or $N_2$ gas into a furnace.

From the view point of producing even more of the specific pore ratio and further suppressing variations in the specific resistance, it is preferable to make the atmosphere vacuum consistently before and during the sintering (see Nos. 3 and 4 in Table 2 described below).

The conditions during the sintering are preferably controlled to a temperature of 700° C. to 1000° C. under a pressure of 10 to 100 MPa. Relative density of the sintered body is increased in these conditions.

When the sintering temperature is higher than 700° C., the relative density of a sintered body is improved. On the other hand, when the sintering temperature is lower than 1000° C., a weight loss by sintering is suppressed and the relative density of a sintered body is improved. The sintering temperature is more preferably 800° C. to 950° C.

Similarly, when the pressure during the sintering is controlled to 10 MPa or larger, the relative density of the sintered body improves, On the other hand, when the pressure during the sintering is 100 MPa or lower, damage in a graphite mold may be suppressed. The pressure may preferably be 20 to 50 MPa.

In the sintering, the sintered body may be retained when reached the maximum temperature range. The retention time at that time may vary depending upon the temperature and pressure in the sintering, but may preferably be about 100 hours or shorter. When the sintering temperature is set to the optimum range in relation to the raw material or others, the retention time may be set to zero (0) hour.

(Heating Treatment after Sintering)

The sintered body is then subjected to a heating treatment under an oxygen-containing atmosphere, which decreases the specific resistance of the sintered body. As described in the above, sintering by the hot press is carried out using a graphite mold in the present invention from the view point of securing a large region having a predetermined pore ratio. The sintered body has high specific resistance after the hot press. It is supposed to be due to oxygen deficiency in the sintered body caused by reduction reaction in the raw material which is in contact to the graphite mold. Therefore, the specific resistance of the sintered body is decreased finally by subjecting the sintered body to the above-described heating treatment in an oxygen-containing atmosphere which compensates oxygen deficiency caused by the reduction reaction.

The atmosphere containing oxygen represents for example an environment containing oxygen of 20 volume % or more, typically an atmospheric environment. It preferably contains oxygen of 50 volume % or more, more preferably 90 volume % or more, and even more preferably 100 volume %.

In the heat treatment it is important to perform the heating in an oxygen-containing atmosphere to attain the desired characteristics, and specific heat treatment conditions may appropriately be controlled in relation to the kind of raw material to be used, the size of a sintered body, the volume of a sintered body to be heat treated at one time, and others. It is recommended to conduct the heat treatment in a temperature range of 300° C. to 1200° C. for about 1 to 100 hours, for example.

When the heat treatment temperature is excessively low, the specific resistance remains high as it is after the sintering in the order of about $10^8$ Ω-cm, thereby making it impossible to attain low specific resistance. On the other hand, when the heat treatment temperature is excessively high, a weight loss by sintering becomes prominent, thereby making it impossible to obtain a favorable sintered body. More preferable heating temperature is 600 to 1100° C., and particularly preferable heating temperature is 800 to 1000° C.

The heating time may preferably be about 100 hours or shorter. When the heating time is excessively long, a weight loss becomes prominent, thereby making it impossible to obtain a favorable sintered body. More preferable heating time is 5 to 20 hours, and particularly preferable heating time is 8 to 15 hours.

The heating time may preferably be controlled in an appropriate manner in relation to the heating temperature until desired low specific resistance can be attained. As a general tendency, higher heating temperature or longer heating time tends to provide lowered specific resistance. Therefore, when the heating temperature is higher, the heating time can be set shorter, whereas when the heating temperature is lower, the heating time may preferably be set longer. For example, when the heating temperature is as low as about 300° C., the heating time may preferably be set longer. On the other hand, when the heating temperature is relatively high, it becomes to attain low specific resistance regardless of the heating time.

The sintered body obtained as described above is subjected to machining as needed, thereby obtaining the sputtering target of the present invention. The sputtering target is bonded to a backing plate. The resultant sputtering target has the same characteristics such as high relative density, suppressed variation of specific resistance, and low specific resistance as those of the sintered body.

(Sputtering Target Containing $LiCoO_2$)

The $LiCoO_2$-containing sputtering target according to the present invention has an area C representing the sputtering surface, and a relative density of the entire sputtering target of 75% or higher. When D1 represents an area of a region in which the area ratio that is occupied by pores is 10% or larger in the sputtering surface, the ratio of D1 to the area C is 50% or larger in the sputtering target. In addition, when D2 represents an area of a region having a specific resistance of $1.0 \times 10^2$ Ω-cm or smaller in the sputtering surface, the ratio of D2 to the area C is 25% or larger in the sputtering target. C, D1, and D2 in the sputtering target correspond to A, B1, and B2 in the $LiCoO_2$-containing sintered body, respectively. Details and preferred ranges of C, D1, and D2 may be referred to those of A, B1, and B2 as described above.

The sputtering target may thus be favorably used for DC sputtering or the like. Shape of the sputtering target is not particularly limited, and may be plate-shape, disk-shape, cylinder-shape, or the like.

The sputtering target of the present invention may have the same size as the sintered body obtained as described above. The resultant sputtering target may also have the same characteristics as those of the oxide sintered body. Alternatively, the sputtering target of the present invention may be cut out in an arbitrary size from a sintered body obtained as described above so that the sputtering target has the above-described properties as explained below in Example 2.

EXAMPLES

The present invention is described hereinafter more specifically providing experimental examples, but the present invention is not limited to the following Examples. The present invention can be put into practice after appropriate modifications or variations are added within a scope adaptable to the spirit of the present invention, all of which are included in the technical scope of the present invention.

Example 1

A variety of sintered bodies (Nos. 1 to 4) summarized in Table 2 were prepared by varying sintering conditions and characteristics of each of the sintered bodies were evaluated in the present example.

(Preparation of Oxide Sintered Body)

As the raw material powder, commercially available $LiCoO_2$ powder was used. The powder was a fine particle material having a purity of 99.99% or higher and an average particle size of 10 μm or smaller.

Then, the raw material was directly set in a graphite mold of 300 mm in diameter and 707 $cm^2$ in area, and sintered with a hot press under the conditions shown in Table 2, thereby obtaining a disk-shaped $LiCoO_2$ sintered body having the same size as the graphite mold. In Table 2, "vacuum" represents vacuum of smaller than 3 Pa.

The sintered body thus obtained was heated to 900° C. in an oxygen environment (100 volume % oxygen) and held at the temperature for 11 hours.

Respective relative density of the sintered bodies obtained as described above was determined. Specifically, an apparent density of a sintered body measured by the Archimedes method was divided by theoretical density of $LiCoO_2$ 5.06 g/$cm^3$.

Moreover, for each of the sintered bodies, the area ratio of the region having the pore ratio of 10% or larger (B1/A) as well as the area ratio of the region satisfying the specific resistance of $1.0 \times 10^2$ Ω-cm or smaller (B2/A) were measured.

(1) Measurement Method for Area Ratio of Region Having the Pore Ratio of 10% or Larger (B1/A)

The area ratio B1/A in a sintered body of disk shape was derived from ratio of radius of the sintered body, that is, ratio of radius r1 to radius of the sintered body R (r1/R). The details are explained in the following.

Figure 1:
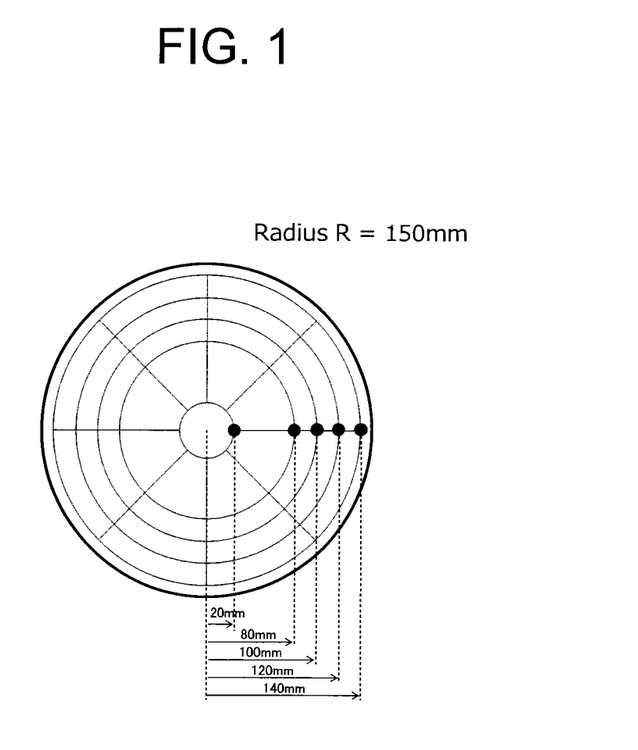
FIG. 1 is a top view of sputtering surface of the sintering body (300 mm in diameter, radius R=150 mm) used in Example 1.

FIG. 1 is a top view of a sputtering surface corresponding to a surface of flat plate shape in the sintering body (300 mm in diameter, radius R=150 mm) used in Example 1. According to preliminary experiment conducted by the present inventors, the pore ratio and the specific resistance were varied depending on the distance from the center region regardless of the direction including those of the upward and downward, leftward and rightward, and diagonal directions, that is, the trend was rotationally symmetric. The measurements of the pore ratio and the specific resistance were thus carried out along just one direction from the center of the sintered bodies in the present Example. Measurement spots (total of 5 spots) of the specific resistance and the pore ratio were 20 mm, 80 mm, 100 mm, 120 mm, and 140 mm away from the center region as indicated in FIG. 1 in the present Example.

Specifically, specimens of 150 μm×220 μm in size were collected from each of the measurement spots (total of the 5 spots). After being embedded in a resin, a surface of the specimen was exposed by polishing the cross-sectional surface. The polished surface was observed in a SEM (scanning electron microscope). By way of detecting all of the pores present in the field for the observation of 150 μm×220 μm in size and summing up the area, a ratio of the total area to an area at each of the distances from the center region (referred to as ratio of total area of pores hereinbelow)

Figure 2A:
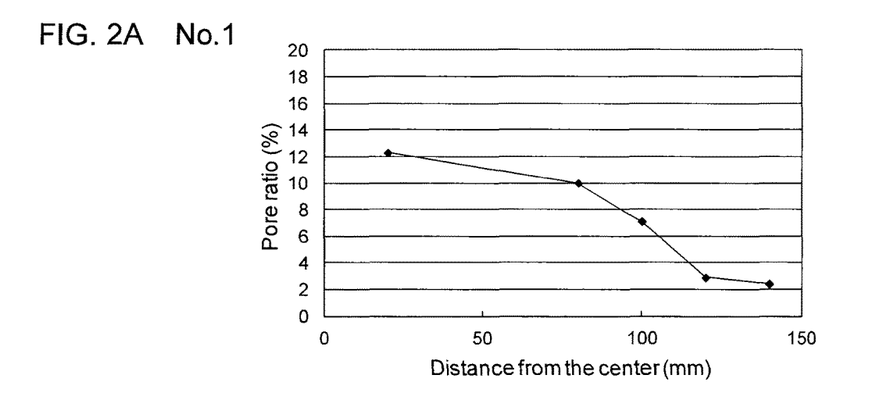
FIGS. 2A to 2C are graphs indicating pore ratio in a specific area at each distance from the center region within the field for the observation of 150 μm×220 μm in size of the sintered bodies Nos. 1 to 3 explained in Example 1.
Figure 2B:
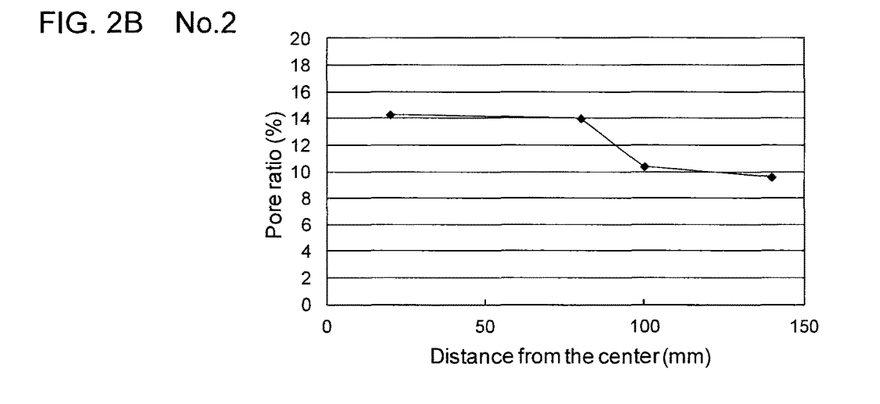
Figure 2C:
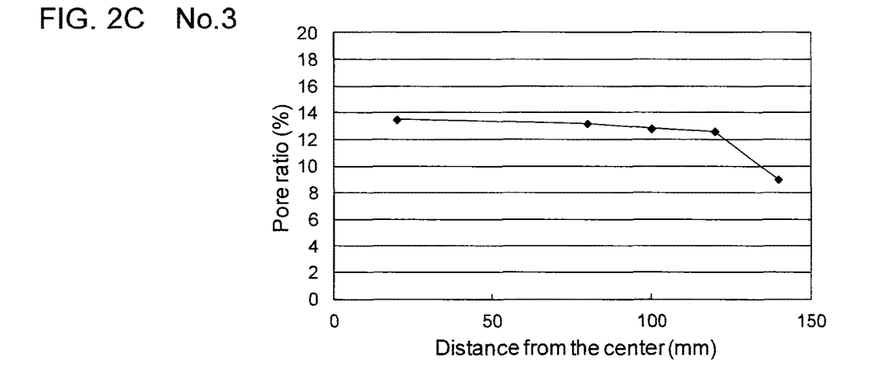

Among sintered bodies No. 1 to 4 indicated in later-described Table 2, results of the measurement for Nos. 1 to 3 are summarized in Table 1 for reference. Further, relationship between the distance from the center region and the ratio of total area of pores is indicated in FIG. 2.

By dividing the radius r1, the distance from the center region thus determined by the radius R of the sintered body (R=150 mm in the present Example) and raising to the second power, that is, $(r1/R)^2$, the area ratio B1/A of the region for which the pore ratio was 10% or larger was calculated. The R is a radius corresponding to the "area A corresponding to the sputtering surface in the sintered body".

(2) Measurement Method for Area Ratio (B2/A) of the Region Having Specific Resistance of $1.0 \times 10^2$ Ω-Cm or Smaller The area ratio B2/A was determined in a similar manner to the calculation method of the above-described pore ratio (B1/A).

The specific resistance was measured by a four-point terminal method at each measurement spot of the total of 5 spots of 20 mm, 80 mm, 100 mm, 120 mm, and 140 mm away from the center in a similar manner as described above. Specifically, by using a resistivity meter Loresta GP available from Mitsubishi Chemical Analytech Co., Ltd. equipped with a probe having an inter-terminal distance of 1.5 mm, the specific resistance was measured for each of the sintered bodies by contacting the probe so that the center of the probe was placed at the measurement spots.

Figure 3A:
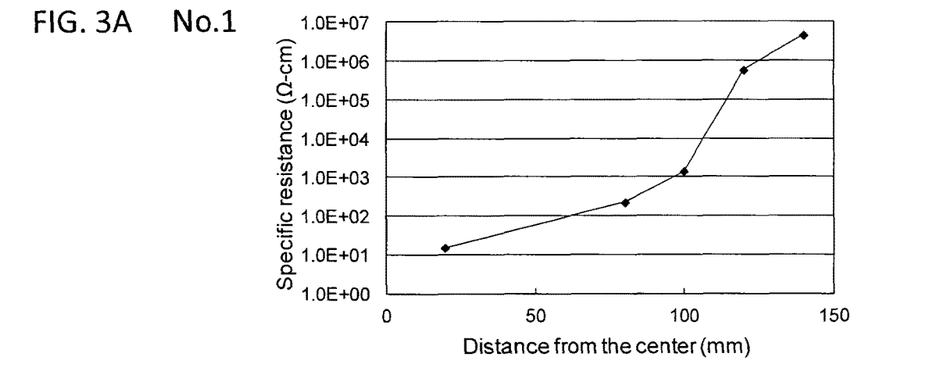
FIGS. 3A to 3C are graphs indicating specific resistance at each distance from the center region of the sintered bodies Nos. 1 to 3 explained in Example 1.
Figure 3B:
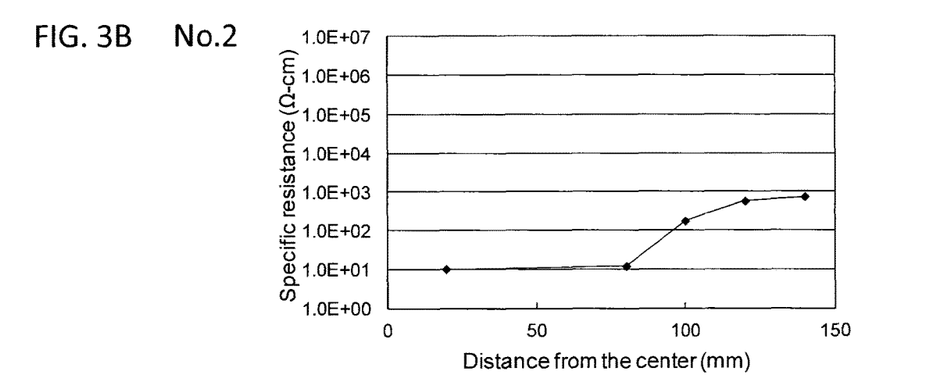
Figure 3C:
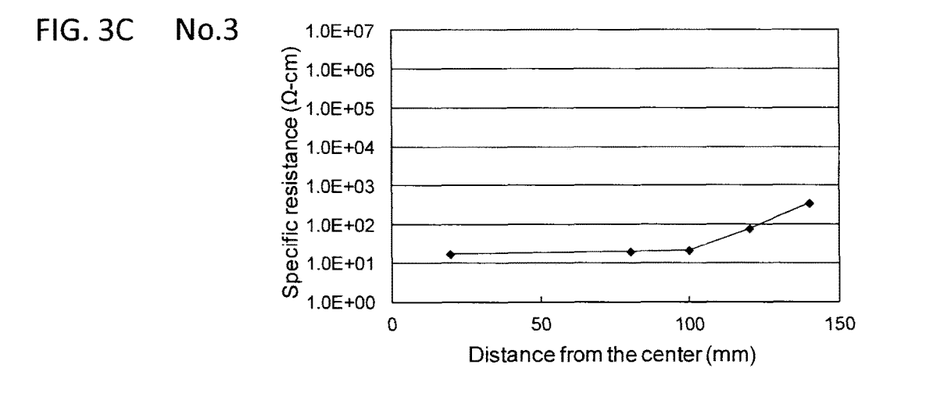

Among the sintered bodies No. 1 to 4 indicated in later-described Table 2, results of the measurement for Nos. 1 to 3 are summarized in Table 1 and FIG. 3 for reference. As elucidated by the results, the specific resistance was $1.0 \times 10^2$ Ω-cm or smaller and smallest in the center region and was increased toward the peripheral region from the center region of the sintered body. Distance from the center region (radius r2) for which the specific resistance became $1.0 \times 10^2$ Ω-cm or smaller was determined from these results. The r2 thus determined are indicated by vertical broken lines in FIG. 3. Respective r2 was a radius corresponding to the area B2 of the region satisfying the specific resistance was $1.0 \times 10^2$ Ω-cm or smaller. Values of the r2 were 62 mm, 95 mm, and 123 mm for No. 1, No. 2, and No. 3, respectively.

TABLE 1

| Distance from the center region (mm) | No. 1 | | No. 2 | | No. 3 | |
|---|---|---|---|---|---|---|
| | Specific resistance (Ω-cm) | Ratio of total area of pores (%) | Specific resistance (Ω-cm) | Ratio of total area of pores (%) | Specific resistance (Ω-cm) | Ratio of total area of pores (%) |
| 20 | 14.9 | 12.3 | 10.1 | 14.3 | 16.8 | 13.5 |
| 80 | 221.1 | 10.0 | 12.1 | 14.0 | 19.6 | 13.2 |
| 100 | 1,391 | 7.1 | 175.1 | 10.4 | 21.0 | 12.8 |
| 120 | $5.7 \times 10^5$ | 2.9 | 579.6 | — | 77.7 | 12.6 |
| 140 | $4.5 \times 10^6$ | 2.4 | 751.7 | 9.6 | 347.4 | 9.0 |

"—" represents unmeasured in Table 1.

As elucidated by the results, the ratio of total area of pores was 10% or more and largest in the center region and was decreased toward the peripheral region from the center region of the sintered body. Distance from the center region (radius r1) for which the ratio of total area of pores became 10% or more was determined from these results. FIG. 2 are graph plots of the results indicated in Table 1, in which r1 are indicated by vertical broken lines. Respective r1 was a radius corresponding to the area B1 of the region satisfying the ratio of total area of pores present in the field for the observation of 150 μm×220 μm in size was 10% or more. Values of the r1 were 80 mm, 120 mm, and 135 mm for No. 1, No. 2, and No. 3, respectively.

By dividing the radius r2, the distance from the center region thus determined, by the radius R of the sintered body (R=150 mm in the present Example) and raising to the second power, that is, $(r2/R)^2$, the area ratio of the region for which the specific resistance was $1.0 \times 10^2$ Ω-cm or smaller was calculated.

By taking simplicity of measurement into consideration, each of the area ratio was determined based on pore ratio and specific resistance at five positions measured toward the direction of the outer periphery from the central region of the sintered body. However, the area ratio specified in the present invention is not limited to that measured by this method. When the pore ratio and the specific resistance indicate different distributions from the sintered bodies used in the present invention, it is preferable to determine each area ratio with higher accuracy by increasing measurement points.

The results are summarized in Nos. 1 to 4 in Table 2. Maximum and minimum values of the pore ratio and the specific resistance are also indicated for reference in the table.

every above-explained example. It was confirmed that the specific resistance remarkably increased (not shown in the tables) when the heat treatment in an oxygen atmosphere was not carried out. Specifically, after preparing a $LiCoO_2$ sintered body having a size of 110 mm×160 mm×t13 mm (t represents thickness) in the same manner as described above, the sintering by the hot press was carried out in the

TABLE 2

| | Sintering by the hot pressing | | | | | Sintered body after heat treatment | | | | | |
|---|---|---|---|---|---|---|---|---|---|---|---|
| | Atmosphere | | | | | Specific resistance (Ω-cm) | | | Pore ratio | | |
| | | | | | | Max-imum | Min-imum | Area ratio of region having specific resistance of $1.0 \times 10^2$ Ω-cm or smaller | Max-imum | Min-imum | Area ratio of region having pore ratio of 10% or larger |
| No. | During heating | During sintering | Heating rate | Temper-ature | Retention time | Relative density | value | value | | value | value | |
| 1 | nitrogen | nitrogen | 5° C./min | 930° C. | 1.3 hr | 93.6% | $4.5 \times 10^6$ | 14.9 | 17% | 12.3% | 2.4% | 28% |
| 2 | vacuum | nitrogen | 5° C./min | 930° C. | 0.9 hr | 82.6% | $7.5 \times 10^2$ | 10.1 | 40% | 14.3% | 9.6% | 64% |
| 3 | vacuum | vacuum | 5° C./min | 900° C. | 1.5 hr | 82.8% | $3.5 \times 10^2$ | 16.8 | 67% | 13.5% | 9.0% | 81% |
| 4 | vacuum | vacuum | 10° C./min | 930° C. | 1.8 hr | 82.2% | $2.0 \times 10^2$ | 6.3 | 81% | 14.4% | 9.9% | 87% |

Results of Table 2 may be considered as follows.

The sintered body No. 1 was an example for which heating prior to the sintering was carried out not in vacuum but in nitrogen atmosphere in the course of the sintering by the hot press. Therefore, the relative density was as high as 93.6%, regions having the specified pore ratio were not sufficiently secured, and variation of specific resistance was observed. Specifically, the pore ratio indicated variation from 12.3% at the maximum and 2.4% at the minimum, and the area ratio of the region having a pore ratio in the range of 10 to 15% was decreased as low as to 28%. Consequently, the area ratio of the region having a specific resistance of $1.0 \times 10^2$ Ω-cm or smaller was as low as 17%, and the variation of the specific resistance was increased.

The sintered bodies Nos. 2 to 4 are, on the other hand, examples prepared under the conditions specified according to the present invention. The high relative density of 75% or higher was secured in the sintered bodies. In addition, variation of the specific density was suppressed because regions having the predetermined pore ratio were sufficiently secured and the specific resistance was low in many regions.

Specifically, the sintered body No. 2 is an example for which the sintering by the hot press was initiated by heating in a vacuum environment and then the environment was switched to nitrogen before carrying out the sintering. As a result, as compared with the sintered body No. 1, regions satisfying the predetermined pore ratio were increased to 64% and regions having the specific resistance of $1.0 \times 10^2$ Ω-cm or smaller were improved to as high as 40% of the entire sintered body.

Further, the sintered bodies No. 3 and No. 4 are examples for which not only the heating but also the sintering was carried out in a vacuum environment in the course of the sintering by the hot press. By heating in a vacuum environment to the hot press in this manner, the region having the specified pore ratio was increased to 81 to 87% and regions having the specific resistance of $1.0 \times 10^2$ Ω-cm or smaller were further enlarged to as high as 67 to 81% of the entire sintered body.

It is noted here that a heat treatment was conducted in an oxygen atmosphere after the sintering by the hot press for following conditions without the heat treatment after the sintering. The specific resistance of such sintered body was $1.23 \times 10^9$ Ω-cm.

Atmosphere during heating: nitrogen;
atmosphere during the sintering: nitrogen;
retention conditions: at 650° C. for 5 hours.

Example 2

In the present example, sputtering targets A to D were prepared by using respective part of the sintered body Nos. 1 to 4 summarized in Table 1. Films were deposited by sputtering using these targets.

(Preparation and Evaluation of Sputtering Target)

Specifically, after machining each of the sintered bodies having a diameter of 300 mm and a radius R=150 mm), a sputtering target of 101.6 mm (4 inches) in diameter and 5 mm in thickness was obtained by cutting out of a part of the sintered bodies so that it contained a region having the pore ratio of 10% or higher. Then the sputtering target was bonded to a backing plate made of Cu by using an indium-based brazing material.

For each of the sputtering targets thus obtained having an area C, relative density of the entire sputtering target was determined in the same manner as explained in Example 1. Moreover, for each of the sputtering targets, the area ratio of the region having the pore ratio of 10% or larger (D1/C) as well as the area ratio of the region satisfying the specific resistance of $1.0 \times 10^2$ Ω-cm or smaller (D2/C) were measured.

A method to obtain target A from a part of the sintered body No. 1 in Table 1 and a method to determine the characteristics are explained with reference to FIG. 5.

Figure 5:
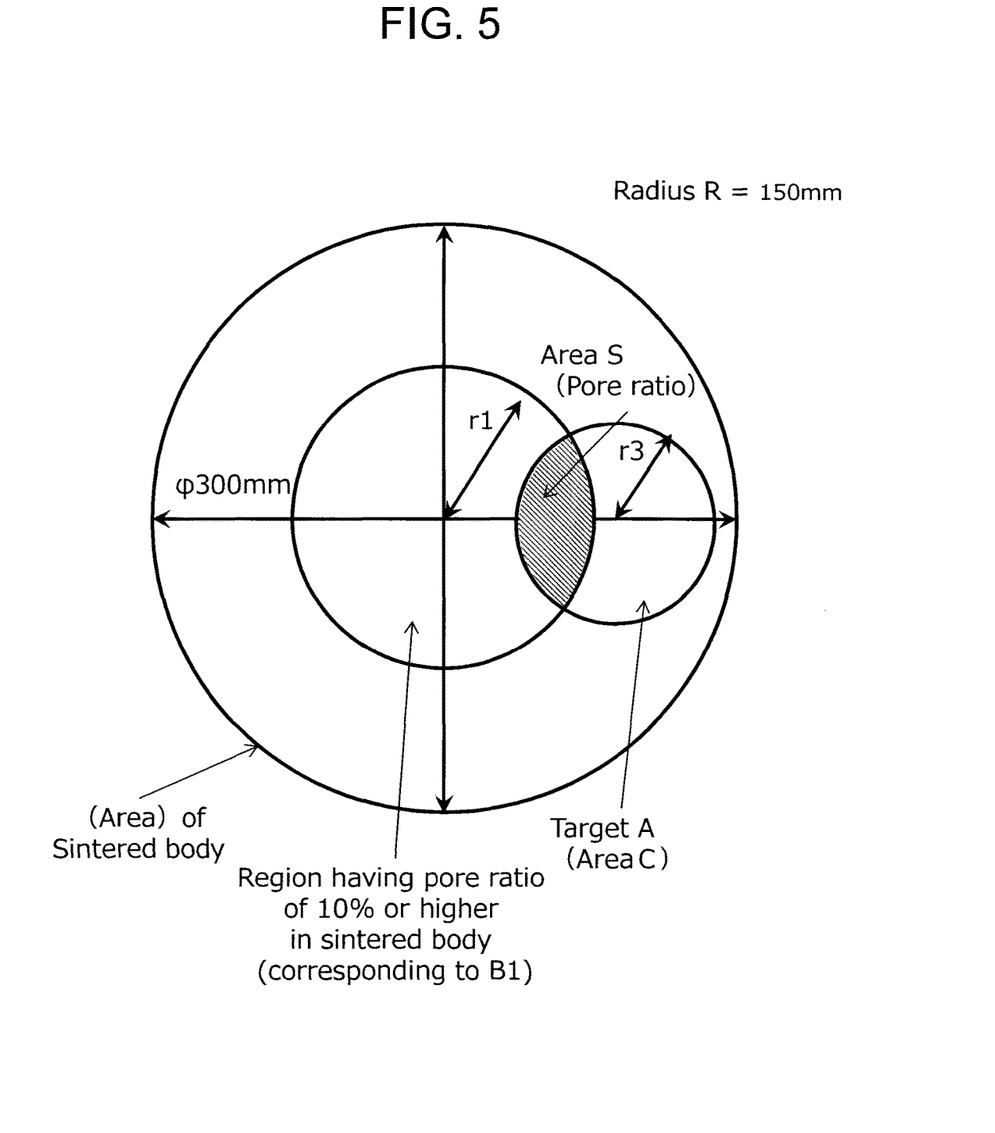
FIG. 5 is a illustration for explaining a position at which the sputtering target A (101.6 mm in diameter, radius R=50.8 mm) described in Example 2 was cut out of the sintering body described in Example 1.

Meaning of each of the signs in FIG. 5 is as follows.

r1: radius r1 of the sintered body No. 1, which is the radius of the region of area B1 having the pore ratio of 10% or larger.

r3: radius of target A

A: area of target A

Area S (pore ratio): area that a circle having a radius r1 overlaps with a circle having a radius r3, which corresponds to the area D1 of the region having the pore ratio of 10% or larger in target A As illustrated in FIG. 5, a sputtering target of 101.6 mm (4 inches) in diameter and 5 mm in thickness was obtained by cutting out of the diameter range from 38.4 mm to 140.0 mm so that it overlapped with the circular region having the radius r1 and the pore ratio of 10% or higher in terms of the area S (pore ratio). By varying the overlapping region, the pore ration of target A may be changed.

And by calculating the area S (pore ratio)/C, a ratio of the area D1 (D1/C) of the region satisfying the ratio of total area of pores is 10% or more may be derived.

A sputtering target was obtained in the same manner as described above, and the D2/C may be derived regarding the specific resistance.

The results are summarized in targets A to D in Table 3. Maximum and minimum values of the pore ratio and the specific resistance are also indicated for reference in the table.

TABLE 3

| | | | Characteristics of sputtering target | | | | | |
|---|---|---|---|---|---|---|---|---|
| | | | Specific resistance ($\Omega$-cm) | | | Pore ratio | | |
| No. | No. in Table 1 | Relative density | Maximum value | Minimum value | Area ratio of region having specific resistance of $1.0 \times 10^2$ $\Omega$-cm or smaller | Maximum value | Minimum value | Area ratio of region having pore ratio of 10% or larger |
| Target A | 1 | 93.6% | $4.5 \times 10^6$ | 43.7 | 14% | 11.7% | 2.4% | 33% |
| Target B | 2 | 82.6% | $7.5 \times 10^2$ | 10.9 | 51% | 14.2% | 9.6% | 83% |
| Target C | 3 | 82.8% | $3.5 \times 10^2$ | 17.9 | 87% | 13.4% | 9.0% | 97% |
| Target D | 4 | 82.2% | $2.0 \times 10^2$ | 7.9 | 98% | 14.3% | 9.9% | 100% |

Following deposition experiments were carried out by using each of the targets thus obtained.

Film Deposition by DC Sputtering

Film deposition apparatus: an DC magnetron sputtering apparatus was used.

Film deposition conditions: substrate temperature: 20° C.; DC discharge power: 160 W; sputtering gas pressure: 3 mTorr; sputtering gas: Ar was used; and thickness of the deposited film: 500 nm.

Film deposition sequence: Each of the targets was mounted on the sputtering apparatus, and a glass substrate was placed on a substrate stage opposite to the target. The inside of a chamber was made to the vacuum at a pressure of $8 \times 10^{-4}$ Pa or lower by a vacuum pump. Then, the sputtering gas was fed to the inside of the chamber using a mass flow. The sputtering gas pressure was adjusted to 3 mTorr, and a high voltage was applied to the target using a DC (direct current) power supply to cause plasma discharge. The discharge power was adjusted to 160 W, and a film was deposited to have a thickness of 500 nm.

As a result, arcing marks due to abnormal discharge were caused even in DC sputtering deposition in the target A which was manufactured by using the sintered body No. 1 in Table 1 for which atmosphere has not been controlled prior to the sintering.

On the other hand, sputtering deposition in a stable manner without abnormal discharge was attained in the targets B to D which were manufactured by the sintered bodies No. 2 to 4 in Table 1 for which the atmosphere has been controlled as specified by the present invention.

The above results confirmed that the use of the sintered body and the sputtering target fulfilling the requirements of the present invention makes it possible to stably form films without generation of abnormal discharge. Therefore, the present invention is extremely useful from the viewpoint that the thin films can be provided with high energy density and high deposition rate by the use of sputtering targets as described above.

While the invention has been described in detail with reference to specific embodiments, it is apparent to those skilled in the art to be able to make various changes and modifications without departing from the spirit and scope of the present invention. The present application claims the benefit of priority based on Japanese Patent Application No. 2013-050929 filed on Mar. 13, 2013, of which disclosure is incorporated by reference herein in its entirety.

The invention claimed is:

1. A sintered body containing $LiCoO_2$ used for a sputtering target, comprising
   an area A, corresponding to a sputtering surface, of 200 cm$^2$ or larger and 1500 cm$^2$ or smaller,
   a relative density of the entire sintered body of 75% or higher,
   a ratio of B1 to the area A is 50% or larger wherein B1 represents an area of a region in which the area ratio that is occupied by pores is 10% or larger in the surface corresponding to the sputtering surface,
   a ratio of B2 to the area A is 25% or larger wherein B2 represents an area of a region having a specific resistance of $1.0 \times 10^2$ $\Omega$-cm or smaller in the surface corresponding to the sputtering surface.

2. A sputtering target containing $LiCoO_2$ in which C represents an area of the sputtering surface, comprising
   a relative density of the entire sputtering target of 75% or higher,
   a ratio of D1 to the area C of 50% or larger wherein D1 represents an area of a region in which the area ratio that is occupied by pores is 10% or larger in the sputtering surface, and
   a ratio of D2 to the area C of 25% or larger wherein D2 represents an area of a region having a specific resistance of $1.0 \times 10^2$ $\Omega$-cm or smaller in the sputtering surface.

3. A method for producing the sintered body containing $LiCoO_2$ as set forth in claim 1, comprising
   sintering by a hot press method using a graphite mold wherein
   environment of heating prior to the sintering is controlled to a vacuum atmosphere, and
   a heat treatment is conducted in an atmosphere containing oxygen after the sintering by the hot press.

4. The production method as set forth in claim 3 wherein the sintering by the hot press is conducted in a vacuum atmosphere.

5. The production method as set forth in claim 3 wherein the sintering by the hot press is conducted at a temperature of 700 to 1000° C. and at a pressure of 10 to 100 MPa.

6. The production method as set forth in claim 3 wherein the heat treatment is conducted at a temperature of 300° C. or higher and 1200° C. or lower.

* * * * *